US008295040B2

(12) United States Patent
Knopf et al.

(10) Patent No.: US 8,295,040 B2
(45) Date of Patent: Oct. 23, 2012

(54) COOLING ARRANGEMENT FOR SMALL FORM FACTOR DESKTOP COMPUTER

(75) Inventors: Eric A. Knopf, Mountain View, CA (US); David P. Tarkington, Sunnyvale, CA (US); Matthew D. Rohrbach, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 196 days.

(21) Appl. No.: 12/894,050

(22) Filed: Sep. 29, 2010

(65) Prior Publication Data

US 2011/0304976 A1 Dec. 15, 2011

Related U.S. Application Data (60) Provisional application No. 61/355,138, filed on Jun. 15, 2010, provisional application No. 61/355,144, filed on Jun. 16, 2010, provisional application No. 61/355,145, filed on Jun. 16, 2010, provisional application No. 61/355,150, filed on Jun. 16, 2010.

(51) Int. Cl.
*H05K 7/20* (2006.01)

(52) U.S. Cl. ......... 361/679.47; 361/679.48; 361/679.49; 361/695

(58) Field of Classification Search .................. None
See application file for complete search history.

(56) References Cited

U.S. PATENT DOCUMENTS

| | | | |
|---|---|---|---|
| 4,982,303 A | 1/1991 | Krenz | |
| 5,546,654 A | 8/1996 | Wojnarowski et al. | |
| 5,820,236 A | 10/1998 | Aoki | |
| 6,172,870 B1 | 1/2001 | Novotny | |
| 6,238,181 B1 * | 5/2001 | Chen | 415/175 |
| 6,423,928 B1 | 7/2002 | Piwczyk | |
| 6,459,576 B1 | 10/2002 | Bhatia et al. | |
| 6,574,115 B2 | 6/2003 | Asano et al. | |
| 6,639,796 B2 | 10/2003 | Cannon | |
| 6,918,174 B2 | 7/2005 | Kim et al. | |
| 6,919,532 B2 | 7/2005 | Swenson et al. | |
| 6,985,355 B2 | 1/2006 | Allirot | |

(Continued)

FOREIGN PATENT DOCUMENTS

WO    WO 2010/050971    5/2010

OTHER PUBLICATIONS

LPC-395F Fanless Mini PC with Removable Hard Drive and Compact Flash, http://www.stealth.com/littlepc_395_fanless.htm, Nov. 2009, 3 pgs.

*Primary Examiner* — Boris Chervinsky (74) *Attorney, Agent, or Firm* — Womble Carlyle Sandridge & Rice LLP (57) ABSTRACT

A small form factor desktop computing device having a suitable internal cooling arrangement is disclosed. The device can be formed of a single piece seamless housing machined from a single billet of aluminum. The single piece seamless housing includes an aesthetically pleasing foot support having at least a portion formed of RF transparent material that provides easy user access to selected internal components as well as offers electromagnetic shielding. The device can also include a removable foot, a heat producing element, a fan, an air processing manifold having a plurality of angled fins, and a heat exchanger.

13 Claims, 8 Drawing Sheets

U.S. PATENT DOCUMENTS

| | | |
|---|---|---|
| 7,054,165 B2 | 5/2006 | Yi-Lung |
| 7,104,817 B2 | 9/2006 | Shiue et al. |
| 7,114,245 B2 | 10/2006 | Ogimoto |
| 7,182,118 B2 | 2/2007 | Cheung et al. |
| 7,262,735 B2 | 8/2007 | Noe |
| 7,355,845 B2 | 4/2008 | Kim et al. |
| 7,455,915 B2 | 11/2008 | Johnson |
| 7,457,111 B2 | 11/2008 | Merz et al. |
| 7,532,470 B2 * | 5/2009 | Ariga ............................ 361/695 |
| 7,539,009 B2 * | 5/2009 | Hata et al. ................. 361/679.47 |
| 7,643,284 B2 * | 1/2010 | Nakamura ............... 361/679.47 |
| 7,649,736 B2 * | 1/2010 | Hongo ..................... 361/679.47 |
| 7,719,831 B2 * | 5/2010 | Fujiwara ................... 361/679.47 |
| 7,724,532 B2 | 5/2010 | Zadesky et al. |
| 7,894,184 B2 * | 2/2011 | Huang et al. ............. 361/679.48 |
| 7,995,343 B2 * | 8/2011 | Suzuki et al. .................. 361/699 |
| 8,072,754 B2 * | 12/2011 | Zhang et al. .................. 361/695 |
| 2004/0174676 A1 | 9/2004 | Shi-Tsung |
| 2004/0246677 A1 | 12/2004 | Chen |
| 2004/0252455 A1 | 12/2004 | Yi-Lung |
| 2005/0259389 A1 | 11/2005 | Lin |
| 2007/0177294 A1 | 8/2007 | Adachi |
| 2007/0211422 A1 | 9/2007 | Liu et al. |
| 2008/0094795 A1 | 4/2008 | Neal et al. |
| 2010/0008040 A1 | 1/2010 | Weber et al. |
| 2010/0044855 A1 | 2/2010 | Eichelberger et al. |
| 2010/0091442 A1 | 4/2010 | Theobald et al. |
| 2010/0146766 A1 | 6/2010 | Dabov et al. |
| 2010/0238619 A1 * | 9/2010 | Shirasaka ................ 361/679.08 |
| 2011/0063794 A1 * | 3/2011 | Wu .......................... 361/679.47 |

* cited by examiner

COOLING ARRANGEMENT FOR SMALL FORM FACTOR DESKTOP COMPUTER

CROSS-REFERENCE TO RELATED APPLICATIONS

This application claims priority to each of U.S. Provisional Patent Application No. 61/355,138, filed Jun. 15, 2010, entitled "Small Form Factor Desktop Computer;" U.S. Provisional Patent Application No. 61/355,144, filed Jun. 16, 2010, entitled "Electronic Components In A Small Form Factor Desktop Computer;" U.S. Provisional Patent Application No. 61/355,145, filed Jun. 16, 2010, entitled "Cooling Arrangement For Small Form Factor Desktop Computer;" and U.S. Provisional Patent Application No. 61/355,150, filed Jun. 16, 2010, entitled "Manufacturing Fixtures For Small Form Factor Desktop Computer," each of which is incorporated by reference herein in its entirety and for all purposes.

TECHNICAL FIELD

The present invention relates generally to small form factor desktop computing devices, and more particularly to cooling arrangements for such small form factor desktop computing devices.

BACKGROUND

In recent years, small form factor desktop computers such as the Mac Mini™ manufactured by Apple Inc. of Cupertino Calif. have been developed. These small form factor desktop computers provide basic computing services such as those provided by a central processing unit, or CPU, without the traditional I/O devices such as a keyboard and monitor usually associated with a standard desktop computer. By providing basic computer services, the small form factor desktop computer is affordable and can be easily customized for applications that would be unsuitable or at best difficult for the standard desktop computer. For example, the small form factor desktop computer can be easily placed on a shelf or in a cabinet and configured to operate as a media control center. In contrast to the small form factor desktop computer, in order to use the standard desktop computer as the media control center, a sturdy shelf or large cabinet must be used. Moreover, most people would not appreciate a standard desktop computer in plain view and would most likely opt to hide the unit. In this way, the small form factor desktop computer lends itself to applications that would otherwise be unsuitable for a standard desktop computer.

The reduction in size compared to standard desktop computers and the ease of use provide two reasons for the growing popularity of small form factor desktop computers. Factors that contribute to the reduction in size and ease of use can be attributed to the manufacturer's ability to fabricate various operational components in smaller and smaller sizes while increasing their power and/or operating speed. However, this trend of smaller, lighter and more powerful computers presents a continuing design challenge. One design challenge associated with the small form factor desktop computer is the design of the enclosure used to house the various internal components. This design challenge arises from a number conflicting design goals that includes the desirability of making the enclosure lighter and yet rugged and strong in addition to being aesthetically pleasing. Conventional approaches to making computer enclosures lighter rely upon the extensive use of plastic. Although the conventional plastic design is generally lighter, enclosures formed entirely of plastic tend to be more flexible and therefore less rugged. Therefore, in order to strengthen the housing and form a more rigid and rugged structure, thicker plastics are generally used. However, even though the increase in thickness is consistent with a stronger and more rugged enclosure, the thicker plastic adds weight and bulkiness that can lead to user dissatisfaction.

Another design challenge arises from the need to provide adequate cooling for the processors and other electrically active components of the computing device. This challenge is intensified by having so many components compacted into such a tight volume of space. Sufficient considerations for overall device air inlet, overall device air outlet, cooling air pathways, fan arrangement and/or heat exchanger are typically needed for a computing device, with the design and arrangement of such items being particularly challenging in such a compact device. In addition, the ability to provide adequate air inlet and outlet features without permitting users to view or perceive any internal components of the computing device is often a preferable outcome from an aesthetic standpoint.

While many designs and techniques used to provide cooling for small form factor desktop computing devices have generally worked well in the past, there is always a desire to provide further cooling designs and techniques for alternative small form factor and aesthetically pleasing designs. In particular, what is desired are cooling arrangements that allow for the reliable cooling of a small form factor desktop computing device in a small volumetric space without compromising the outward aesthetic appearance of the device.

SUMMARY

It is an advantage of the present invention to provide small form factor desktop computing devices that are lightweight, strong, reliable, aesthetically pleasing and distinctive. Such devices can have reliable cooling arrangements in a compact space that do not compromise an otherwise aesthetically pleasing appearance for the overall device. This can be accomplished at least in part through the use of a fan, heat pipe, unobtrusive air inlets located about the circumference of a bottom positioned removable foot, a radial air flow pattern, and an air outlet fin stack arrangement having fins that are angled sufficiently such that internal portions of the device are not readily visible through the air outlet fin stack.

In various embodiments, a small form factor desktop computer includes a single piece (uni-body) housing. The single piece housing includes a bottom opening arranged to provide access to internal operational components, a front opening arranged to accommodate a plurality of I/O interfaces, and a slot opening suitable for receiving an optical disk such as a DVD. The single piece housing can, in turn, include an integral top portion, side walls and a bottom portion that cooperate to form a cavity in cooperation with the front opening, the bottom opening, and slot opening. The integral top portion has a substantially flat surface and curved edges to meet the side walls having rectilinear edges arranged such that they form a flat side surface. An interior surface of the top portion includes a plurality of etched ground points suitable for connecting electrical components to a chassis ground. The small form factor desktop computer also includes a foot disposed within the bottom opening that can be removed by a user to provide access to at least some operational components enclosed within the single piece housing.

In various embodiments, which can include the foregoing embodiments, a small form factor desktop computing device can include a single piece housing, a removable foot, a heat producing element, a fan, an air processing manifold having a plurality of angled fins, and a heat exchanger. The single piece housing can have a top surface, rear surface, a bottom opening arranged to provide access to internal operational components, a front opening arranged to accommodate a plurality of I/O interfaces, and a slot opening arranged to receive a disk medium. The removable foot can be disposed within the bottom opening and adapted to be removed by a user to provide access to at least some operational components enclosed within the single piece housing, wherein the interface between the single piece housing and removable foot is arranged to permit ambient air intake into the device. The fan can be arranged within the single piece housing and proximate the removable foot, wherein the fan is adapted to process the ambient air intake and disperse the ambient air through an outlet of the fan. The air processing manifold having a plurality of angled fins can have an inlet located proximate to the fan outlet and an outlet located at an opening along the rear surface of the single piece housing. The heat exchanger can be located proximate to the air processing manifold and arranged such that air passing through the air processing manifold directly contacts one or more exterior surfaces of the heat exchanger. The heat exchanger can also include a heat sink portion that is thermally coupled to the heat producing element.

In various detailed embodiments, the removable foot can define a perimeter therearound, wherein at least a substantial portion of the ambient air intake occurs between the perimeter and the outer housing of the device. The perimeter of the removable foot can be of any shape, such as, for example, a round or circular foot. In some embodiments, the entire perimeter of the removable foot can serve as the air intake region. In other embodiments, only a portion of the removable foot perimeter serves as the air intake region. For example, the perimeter of the removable foot can include an air intake region and a no air intake region, wherein none of the ambient air intake occurs at the no air intake region. In such embodiments, the fan can be located proximate the no air intake region, such that an airflow pattern from the air intake region past the no air intake region and into the fan is created thereby.

In various detailed embodiments, a cooling airflow pattern through the device can be defined by the ambient air intake into the device, the fan, and the air processing manifold. Airflow leaving the air processing manifold can be exhausting from the overall device as well at the same time. Where the ambient air intake into the device is at or about the bottom opening, and the air exhaust from the device is at an opening or outlet located at the rear surface of the device, neither of these results in air coming into or out of the device about a top surface of the device. Thus, in some embodiments no airflow comes into or out of the overall device at or near the top surface of the device.

In various further embodiments, a method of cooling a computing device, such as a small form factor computing device, can include the process steps of directing ambient air into an ambient air intake located along an outer housing of the device, passing the ambient air from the ambient air intake through an internal region of the device and to a fan located within the device, processing the ambient air through the fan to an outlet of the fan, dispersing the ambient air from the fan outlet into an air processing manifold having a plurality of angled fins and located within the device, conducting a flow of the ambient air across at least one heat exchanger surface while the ambient air passes through the air processing manifold, and exhausting the ambient air from the device. An additional process step can involve circulating a fluid within one or more heat exchangers from said at least one heat exchanger surface to one or more heat sinks located separately within said one or more heat exchangers. The one or more heat sinks can be thermally coupled to one or more heat producing elements located within the device. Similar to the foregoing embodiments, the ambient air intake can comprise an interface between the outer housing and a removable foot positioned with respect to the outer housing. Also, the step of exhausting can occur when the ambient air leaves an outlet of the air processing manifold.

In still further embodiments of the present invention, a personal computing device can include an outer housing defining an interior cavity and a bottom opening, an ambient air intake into the personal computing device located at or proximate to the bottom opening, at least one heat producing element, a fan located within the outer housing and proximate the bottom opening, and an air processing manifold located within the outer housing and proximate to the fan outlet. The air processing manifold can be arranged to receive air from the fan outlet and pass the air therethrough to an outlet of the air processing manifold and out of said outer housing, such that the air passing through the air processing manifold is adapted to facilitate the cooling of the least one heat producing element. The personal computing device can also include a heat exchanger located proximate to the air processing manifold and arranged such that the air passing through the air processing manifold directly contacts one or more exterior surfaces of the heat exchanger, wherein the heat exchanger also includes at least one heat sink portion that is thermally coupled to the at least one heat producing element. Similar to the foregoing embodiments, the air processing manifold can include a plurality of angled fins adapted to direct the flow of air therethrough. In addition, the personal computing device can also include a removable foot located at the bottom opening of the outer housing. Again, the removable foot can define a perimeter therearound, such that at least a substantial portion of said ambient air intake occurs between the perimeter and the outer housing.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures and arrangements for the disclosed inventive apparatus and method for providing effective cooling in small form factor desktop computing devices. These drawings in no way limit any changes in form and detail that may be made to the invention by one skilled in the art without departing from the spirit and scope of the invention.

DETAILED DESCRIPTION

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

The invention relates in various embodiments to a small form factor desktop computing device, such as the Mac Mini™ manufactured by Apple Inc. of Cupertino, Calif. The small form factor desktop computing device can have an outer housing formed from a single piece of material, such as an aluminum housing formed from a single billet of aluminum, such that it comprises a uni-body housing. In addition, a suitable cooling arrangement can allow for the adequate cooling of various heated components in a compact volume without significantly sacrificing the overall aesthetic appearance of the device. These general subjects are set forth in greater detail below.

Outer Housing

The single piece seamless housing includes an aesthetically pleasing foot support having at least a portion formed of RF transparent material that provides easy user access to selected internal components as well as offers electromagnetic (EM) shielding. This simplicity of design can accrue many advantages to the small form factor desktop computer besides those related to aesthetic look and feel. For example, fewer components and less time and effort can be required for assembly of the small form factor desktop computer and the absence of seams in the single piece housing can provide good protection against environmental contamination of internal components as well as EM shielding.

In the described embodiments, the single piece seamless housing can be formed from metal. In the case where the single piece seamless housing is formed of metal, the metal can take the form of a single billet of aluminum. The single billet of metal can be formed into a shape appropriate for housing various internal components as well as providing various openings into which switches, connectors and so on can be accommodated. The single piece seamless housing can be machined into a desired shape. The shape of the housing can have spline contours in that an upper portion of the housing can have a spline contour. One of the advantages to using metal for the housing is ability of metal to provide good electrical grounding for any internal components requiring a good ground plane. For example, performance of a built in RF antenna can be substantially improved when a good ground plane is provided. Moreover, a good ground plane can be used to help mitigate the deleterious effects caused by, for example, of electromagnetic interference (EMI) and/or electrostatic discharge (ESD).

Figure 1:
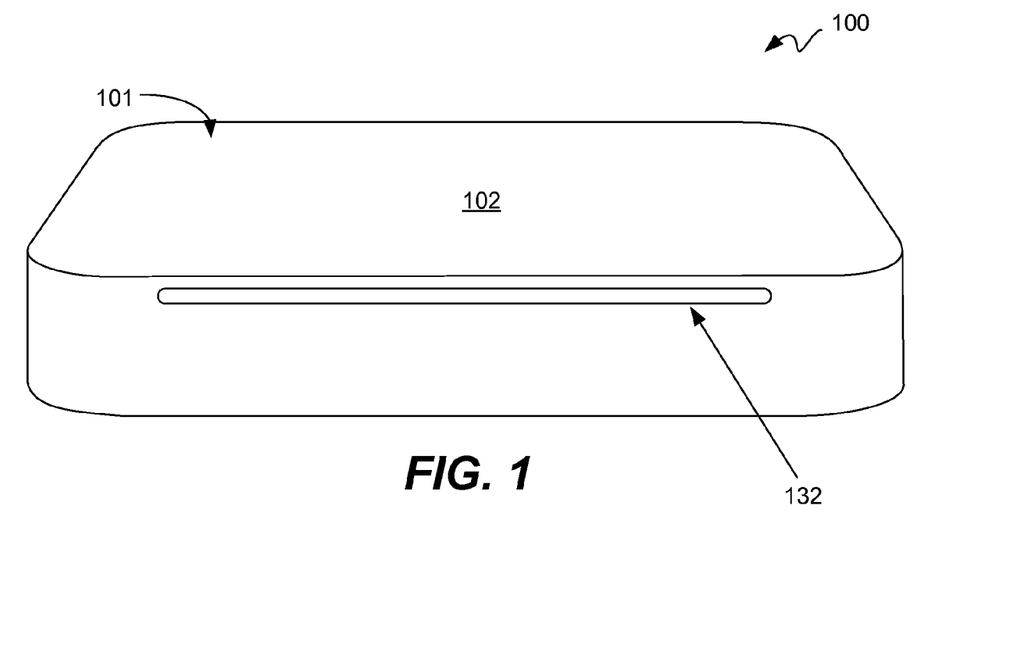
FIG. 1 illustrates in front facing perspective view an exemplary small form factor desktop computing device in an open state according to one embodiment of the present invention.

Turning first to FIG. 1, an exemplary small form factor desktop computing device in an open state is shown in front facing perspective view. Small form factor desktop computer 100 can process data and more particularly media data such as audio, video, images, etc. By way of example, small form factor desktop computer 100 can generally correspond to a device that can perform as a music player, game player, video player, media center and/or the like. Small form factor desktop computer 100 can be easily placed in a convenient location such as a desktop, shelf or small cabinet due to both the small footprint and lightweight of small form factor desktop computer 100. Small form factor desktop computer 100 can include single piece seamless housing 102 formed of metal such as aluminum which can be processed into a desired shape. In those cases where small form factor desktop computer 100 has a metal housing and incorporates RF based functionality, it may be advantageous to provide at least a portion of housing 102 in the form of radio (or RF) transparent materials. The radio transparent material can include, for example, plastic, ceramic, and so on. The wireless communications can be based on many different wireless protocols including for example Bluetooth, RF, 802.11, FM, AM, and so on. Any number of antennas may be used, which can use a single window or multiple windows depending on the needs of the system. Portions of housing 102 can be removed by machining and replaced with radio-transparent materials.

Housing 102 can be configured to enclose any suitable number of internal components associated with the small form factor desktop computer 100. For example, housing 102 can enclose and support internally various structural and electrical components (including integrated circuit chips and other circuitry) to provide computing operations for small form factor desktop computer 100. The integrated circuits can take the form of chips, chip sets, modules any of which can be surface mounted to a printed circuit board, or PCB, or other support structure. For example, a main logic board (MLB) can have integrated circuits mounted thereon that can include at least a microprocessor, semi-conductor (such as FLASH) memory, various support circuits and so on. Housing 102 can include various openings some of which can be used to receive disk based media such as DVDs or CDs whereas other openings can be used during assembly for placing internal components. For example, as shown in FIG. 1, ODD slot opening 132 can be user to accept optical disk media such as DVDs and CDs, whereas Small form factor desktop computer 100 can include a mechanism for wireless communications, as either a transceiver type device or receiver only, such as a radio, small form factor desktop computer 100 can include an antenna that can be disposed internal to a radio transparent portion of housing 102.

Figure 2:
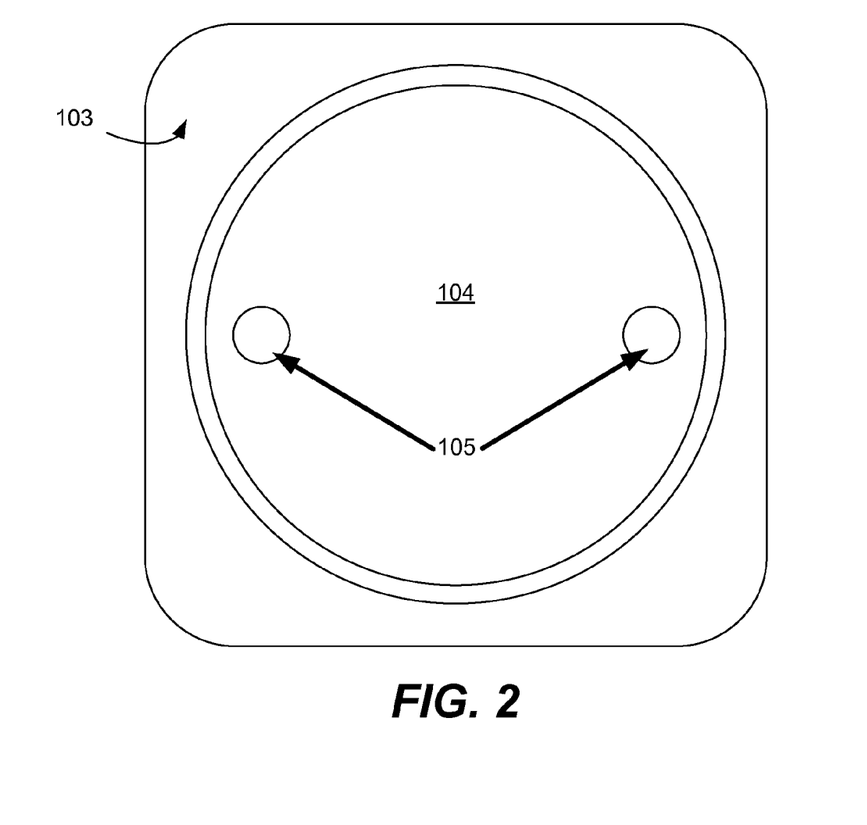
FIG. 2 illustrates in bottom plan view the exemplary small form factor desktop computing device of FIG. 1 with a removable foot installed therein according to one embodiment of the present invention.

FIG. 2 illustrates in bottom plan view the exemplary small form factor desktop computing device of FIG. 1 with a removable foot installed therein according to one embodiment of the present invention. As shown in FIGS. 1 and 2, small form factor desktop computer 100 generally includes a top side 101 and a bottom side 103, with a removable foot 104 being located on the bottom side. Foot 104 can be easily removed using finger recesses 105 to press and rotate foot 104 without the need for a tool to reveal a bottom opening and various internal components.

Figure 3:
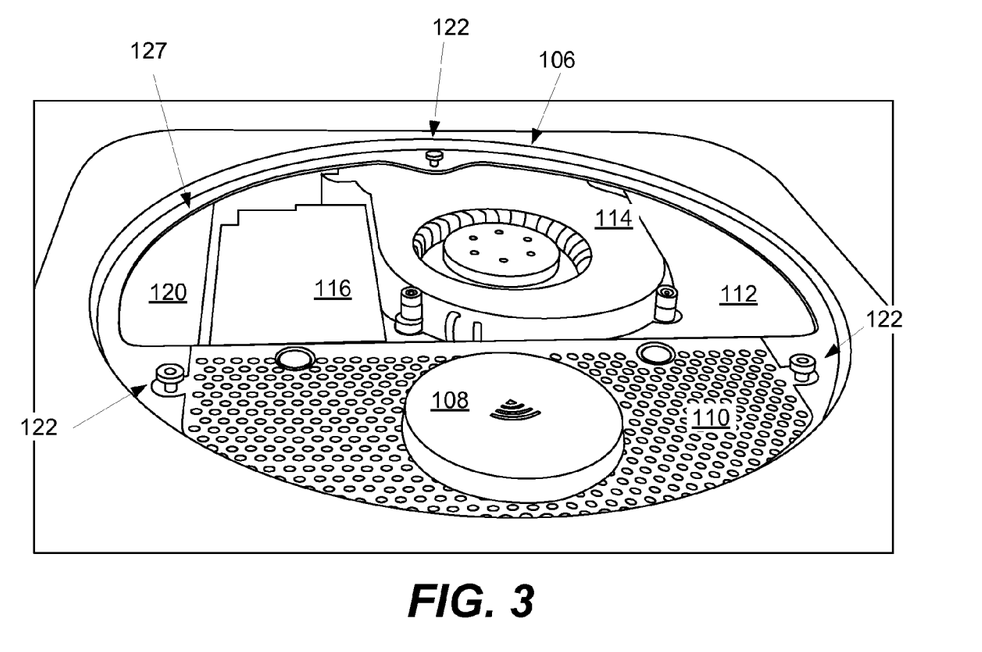
FIG. 3 illustrates in bottom perspective view the exemplary small form factor desktop computing device of FIG. 1 with its removable foot removed therefrom according to one embodiment of the present invention.

Moving next to FIG. 3, the exemplary small form factor desktop computing device of FIG. 1 is illustrated in bottom perspective view with its removable foot removed therefrom. The foot has been removed to expose internal components such as RF antenna 108, antenna plate 110, cowling 112, fan assembly 114, interchangeable memory cards 116, and power supply 120, among other items. It should be noted that cowling 112 is preferably inserted after antenna plate and before fan assembly 114.

By way of removing foot 104, the user is granted easy access to those internal components such as memory cards 116 that the user may want to update. In the described embodiment, foot 104 can be secured to housing 102 and cover opening 106 by spring fasteners 122 that can be disengaged (and therefore release foot 104) by pressing foot 104 while concurrently applying a rotational force to foot 104 at finger recesses 105. In this way, the user can easily access various internal components without the need to use a special tool such as a putty knife, screw driver and so forth. Foot 104 can be formed of slip resistant material and can thus be used to provide slip free support for small form factor desk top computer 100.

Figure 4:
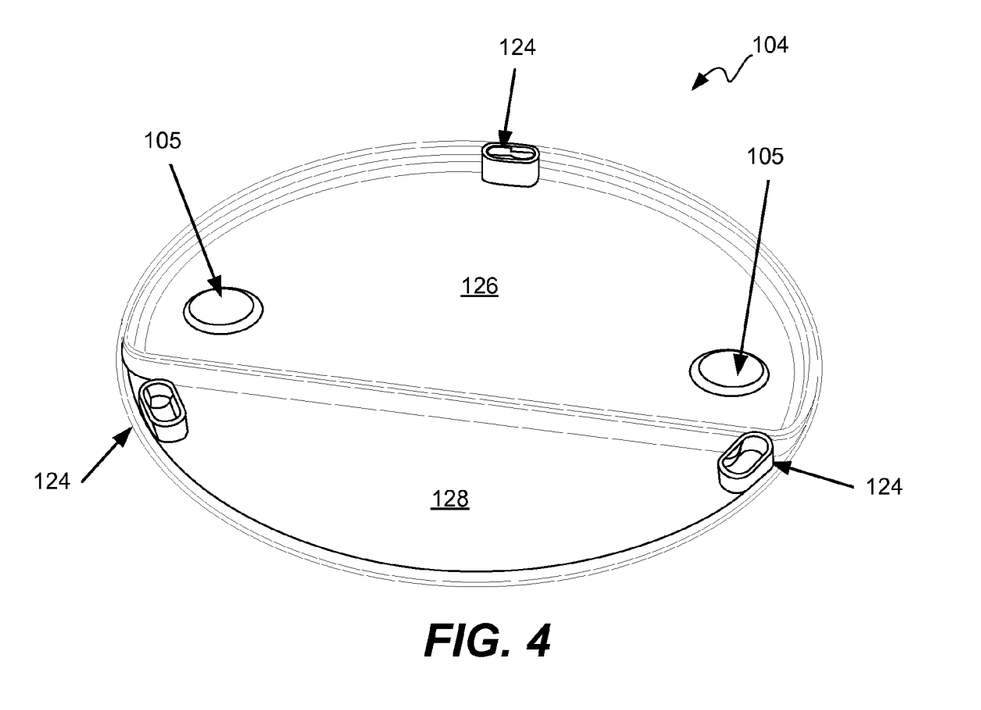
FIG. 4 illustrates in obverse perspective view a removable foot according to one embodiment of the present invention.

FIG. 4 illustrates in obverse perspective view a removable foot according to one embodiment of the present invention. Illustrated here are receptors 124 that are used with fasteners 122 to secure foot 104 to housing 102. As can be seen, receptors 124 are shaped to accommodate the shape of fasteners 122 in such a way that a slight pressing action and rotational movement is all that is required to disengage fasteners 122 and receptors 124. It should be noted that that portion of foot 104 that does not align with antenna plate 110 (which acts as both EM shield and support structure) includes EM shield 126. In this way, housing 102 being formed of metal along with EM shield 126 and antenna plate 110, RF sensitive circuits within small form factor desktop computer 100 or in close proximity to small form factor desktop computer 100 are well shielded from the effects of EMI. It should also be noted that that portion of foot 104 that is part of EM shield 126 is used as an air intake area for fan assembly 114.

It should also be noted that the outer edge of EM shield 126 can help to prevent or severely restrict air intake from ambient air outside the overall device where the EM shield coincides with the outer edge of the removable foot 104. As shown in FIG. 4, this can effectively result in an air intake region 128 at the area of the removable foot where the EM shield 126 is not present. The remaining region is then effectively a "no air intake" region. Where desired, this effect can be accentuated, such as by the use of a raised ridge 127 in the outer housing, as shown in FIG. 3. Such a raised ridge 127 can be integrally formed in outer housing 102 when the housing is originally formed and machined, for example.

Figure 6:
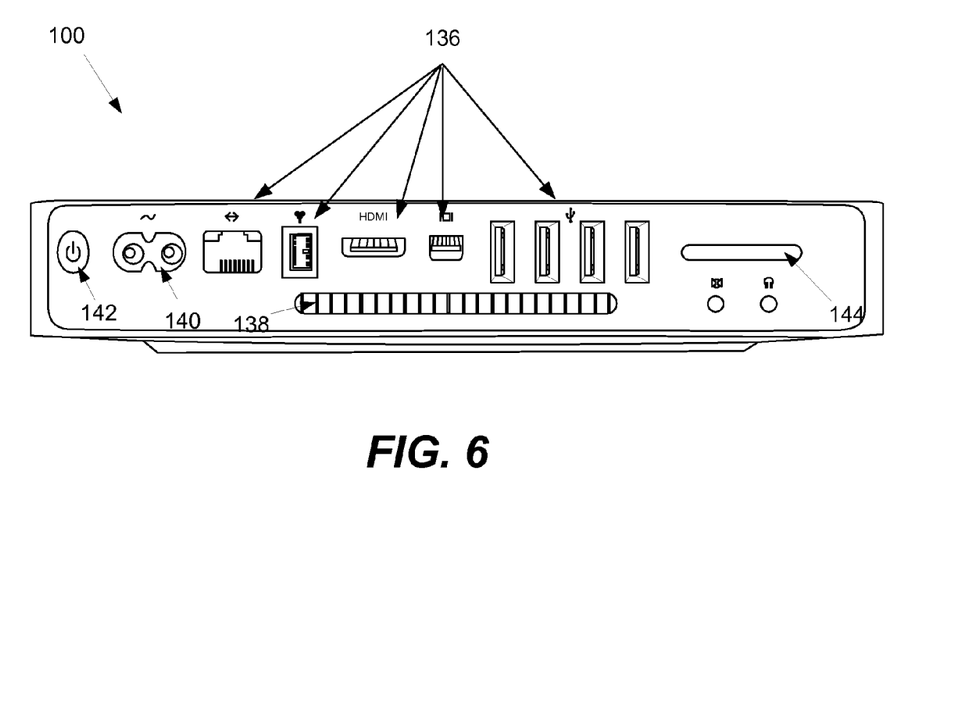
FIG. 6 illustrates in side elevation view an exemplary input and output (I/O) wall inserted into the rear sidewall of an exemplary small form factor desktop computing device according to one embodiment of the present invention.

FIG. 6 illustrates in side elevation view an exemplary input and output (I/O) wall inserted into the rear sidewall of an exemplary small form factor desktop computing device according to one embodiment of the present invention. As shown from the rear, small form factor desktop computer 100 can include an I/O wall insert formed of plastic that includes a plurality of I/O ports 136 (HDMI, FireWire, Ethernet, and so on), an air exhaust vent portion of an air processing manifold 138, AC power receptacle 140, power button 142, and memory card slot 144, among other possible items. Based on this arrangement, it will be appreciated that a cooling airflow exiting the air exhaust vent portion of air processing manifold 138 will also simultaneously be exhausted from the overall computer 100.

Cooling Arrangement

Figure 5A:
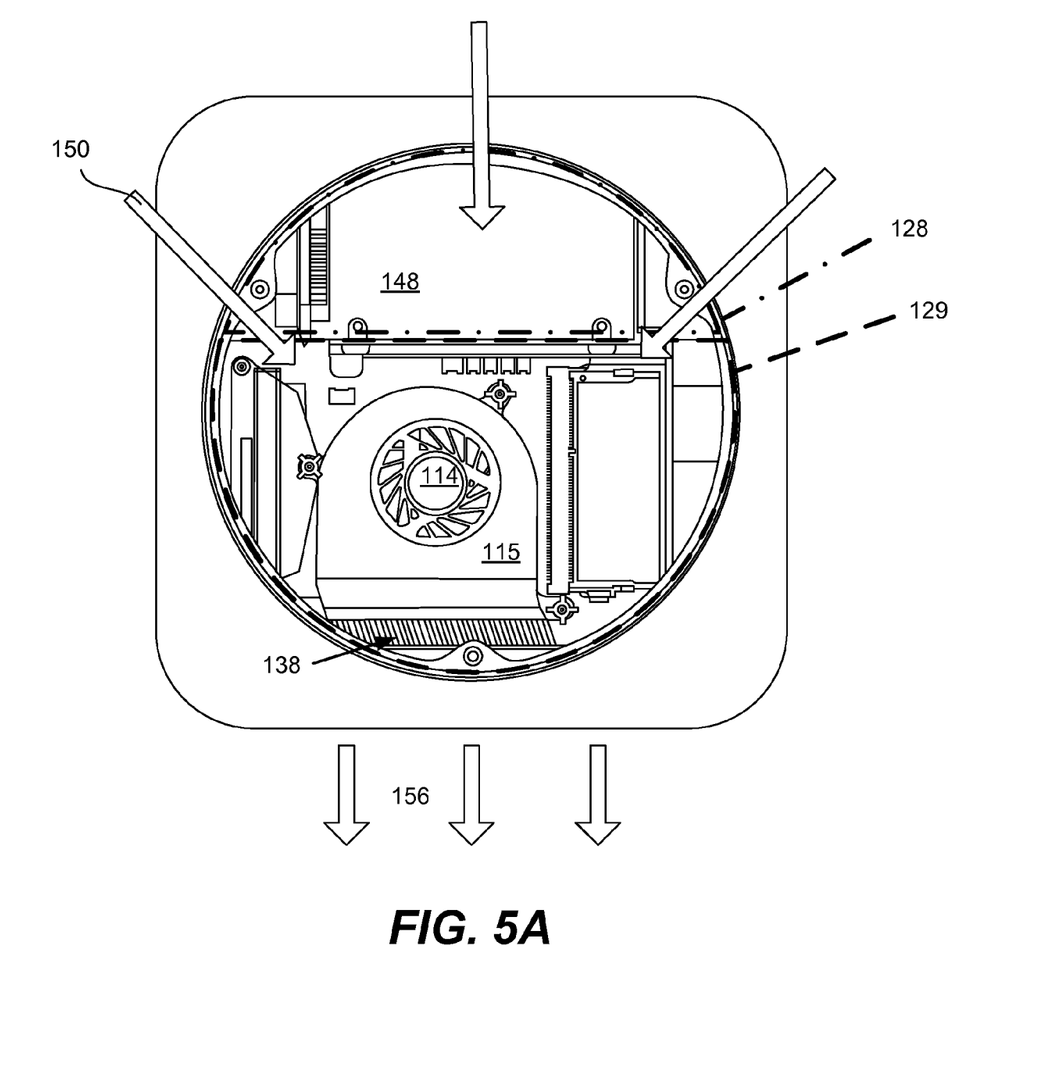
FIG. 5A illustrates in bottom plan view an exemplary airflow diagram for the exemplary small form factor desktop computing device of FIG. 1 according to one embodiment of the present invention.
Figure 5B:
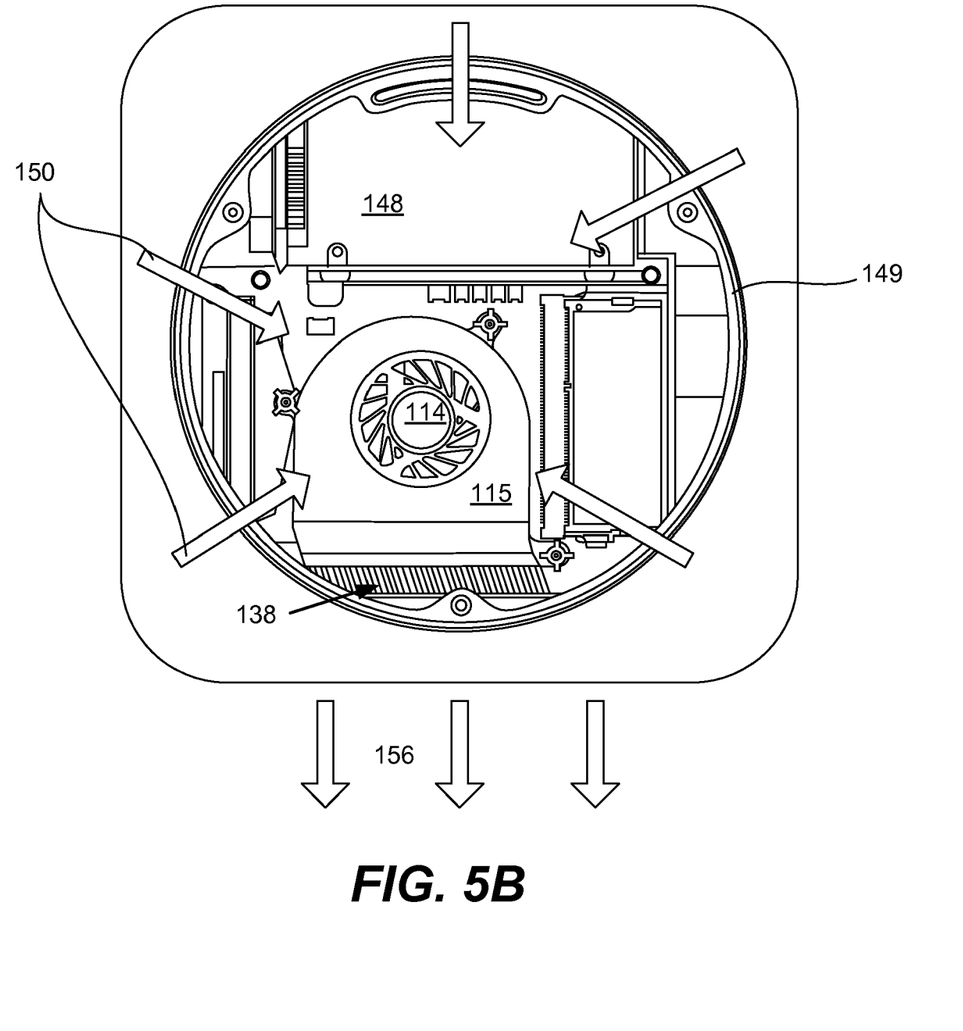
FIG. 5B illustrates in bottom plan view an alternative exemplary airflow diagram for an alternative small form factor desktop computing device according to one embodiment of the present invention.

FIG. 5A illustrates in bottom plan view an exemplary airflow diagram for the exemplary small form factor desktop computing device of FIG. 1 according to one embodiment of the present invention, while FIG. 5B illustrates in bottom plan view an alternative exemplary airflow diagram for an alternative small form factor desktop computing device according to one embodiment of the present invention.

It should be noted that FIG. 5A illustrates an airflow pattern that is observed in the device illustrated in FIGS. 1-4, while FIG. 5B illustrates an airflow pattern in accordance with yet another embodiment having an alternative foot and housing to foot interface. Such an alternative embodiment can have, for example, a bottom opening with castellations (not shown) suitable for engaging an air intake ring 149 that can be used with alternative foot arrangements (not shown). In particular, the embodiment of FIG. 5A includes only a partial region around the circumference of the foot where air is able to be taken into the device. This region is also noted in FIG. 4. Conversely, the alternative embodiment of FIG. 5B is arranged such that air intake can be achieved around the entire circumference of the foot, as shown.

In both FIGS. 5A and 5B, the top side of the depicted figure corresponds to the front side with a disk slot that is depicted in FIG. 1, while the side having the airflow exhaust from the device corresponds to the I/O (rear) side wall depicted in FIG. 6. In both embodiments, ambient air intake 150 into the device is processed through one or more gaps or openings at the interface between the foot and the housing while the foot is installed. This intake air then flows radially to the fan 114 and blower 115 combination, which is located toward the center of the device. This initial intake airflow can traverse one or more internal heated elements, such as HDD, which facilitates the cooling process. The air is then processed through the fan 114 and fan housing/blower 115, and from there into an air processing manifold 138. The air processing manifold can have an angled fin stack to direct the air away from the blower, across a heat pipe or heat exchanger, and ultimately out from the device at a heated exhaust output region 156.

As noted above, a primary difference between the embodiments depicted in FIGS. 5A and 5B is that the embodiment of FIG. 5A has a limited ambient air intake area or region, while the embodiment of FIG. 5B has a larger ambient air intake area or region. Referring to FIG. 5A, this embodiment corresponds to the embodiment of FIG. 4, which again has a removable foot 104 and an EM shield 126 included therewith. When the foot is installed into the bottom opening of the outer housing, the result is an ambient air intake region 128 and a no air intake region 129. These regions can be defined with respect to a perimeter of the removable foot, particularly where the interface between the foot and the housing serves as the ambient air intake of the overall device. As such, the ambient air intake 150 is shown as only occurring about the perimeter of the foot in the air intake region 128.

Conversely, the embodiment of FIG. 5B involves an air intake region that extends substantially around the entire perimeter of the removable foot. Such an air take region can be achieved by, for example, not including a significantly blocking edge of any EM shield and/or not including any raised edge integrated with the housing, such as those shown for the embodiment shown and described for FIG. 5A. It is specifically contemplated that such features, and/or another other suitable airflow preventing or directing features, could be used to allow ambient air intake at one or more select regions along the perimeter of the removable foot. Such selectively blocking or restricting features can then be used to result in an airflow pattern as desired within the overall device. For example, where a greater general airflow across HDD 148 is desired, then selective restricting air intake features can be used such that much or all of the ambient air intake flows across HDD before reaching the input of fan 114. Alternative arrangements to benefit other internal components can also be used, as may be desired.

Figure 7:
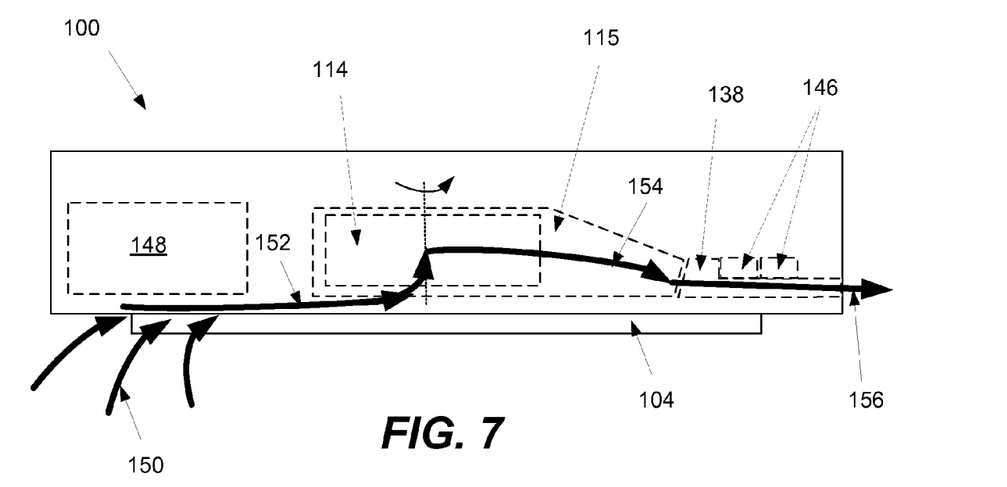
FIG. 7 illustrates in side elevation view an exemplary airflow diagram for an exemplary small form factor desktop computing device according to one embodiment of the present invention.

FIG. 7 illustrates in side elevation view an exemplary airflow diagram for an exemplary small form factor desktop computing device 100 according to one embodiment of the present invention. Similar to the airflow pattern shown in FIG. 5A, intake air 150 enters the device at a select region around the circumference of bottom located foot 104. Once inside the device, the internal airflow path 152 can traverse one or more heated elements 148 until it enters a top or bottom portion of radial rotating fan 114. The continuing airflow path 154 then exits the fan 114 and blower 115 arrangement into the air processing manifold 138, where it encounters a plurality of angled fins arranged in a pattern. A heat pipe or exchanger 146 can have one or more surfaces exposed to open sides and top portions of the corridors defined by the angled fins, such that the airflow cools such surfaces of the heat exchanger. The heated air then exits the device at exhaust output region 156. As will be readily appreciated, heat pipe or exchanger 146 can have a circulating fluid therewithin, with heat being transferred via the internally circulating fluid from a heat sink proximate a heated element to the cooling regions where the cooling airflow passes across an outer surface of the heat pipe or exchanger.

Figure 8:
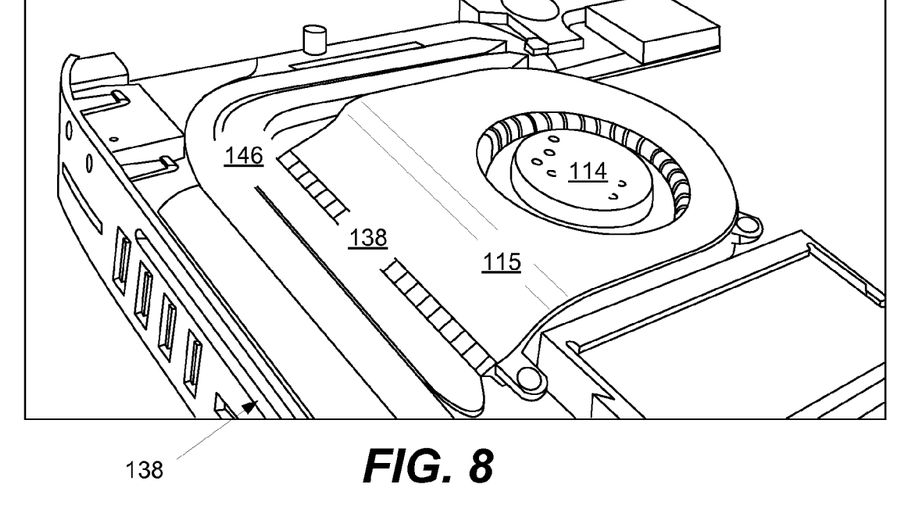
FIG. 8 illustrates in rear perspective view an exemplary set of internal components for a small form factor desktop computing device according to one embodiment of the present invention.
Figure 9:
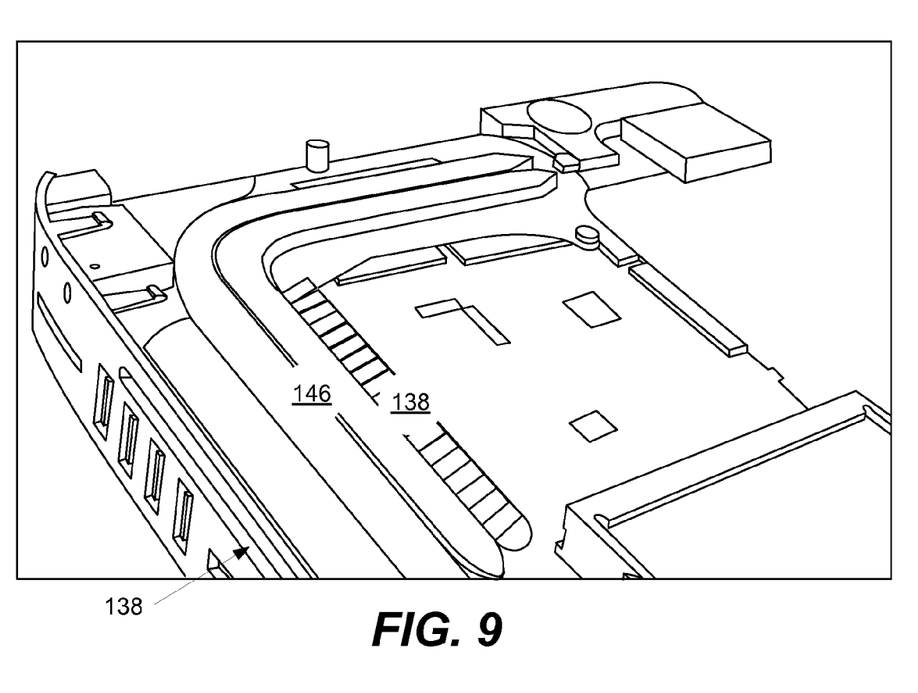
FIG. 9 illustrates in rear perspective view the exemplary set of internal components of FIG. 8 with the fan removed according to one embodiment of the present invention.

FIG. 8 illustrates in rear perspective view an exemplary set of internal components for a small form factor desktop computing device, while FIG. 9 this exemplary set of internal components with the fan and blower removed. Again, radial fan 114 and blower 115 is arranged such that its air output enters an inlet region of air processing manifold 138. Heat exchanger 146 lies atop the fins of the air processing manifold, and the air is ultimately exhausted out from the device at the I/O interface side wall. One particular advantage of the angled fin stack is that air is processed through the device and exhausted within a short distance, without permitting a ready line of sight for an outside user to see into the device. This can improve the overall aesthetic appearance of the device, as the visibility of internal components can be detracting when such views are not expected by a user.

Figure 10:
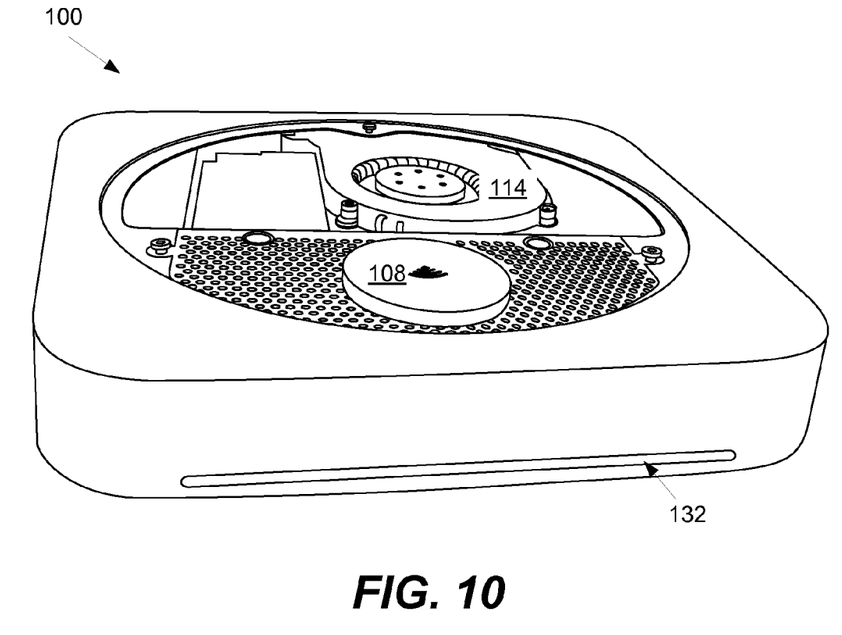
FIG. 10 illustrates in bottom perspective view an exemplary small form factor desktop computing device with its removable foot removed therefrom according to one embodiment of the present invention.
Figure 11:
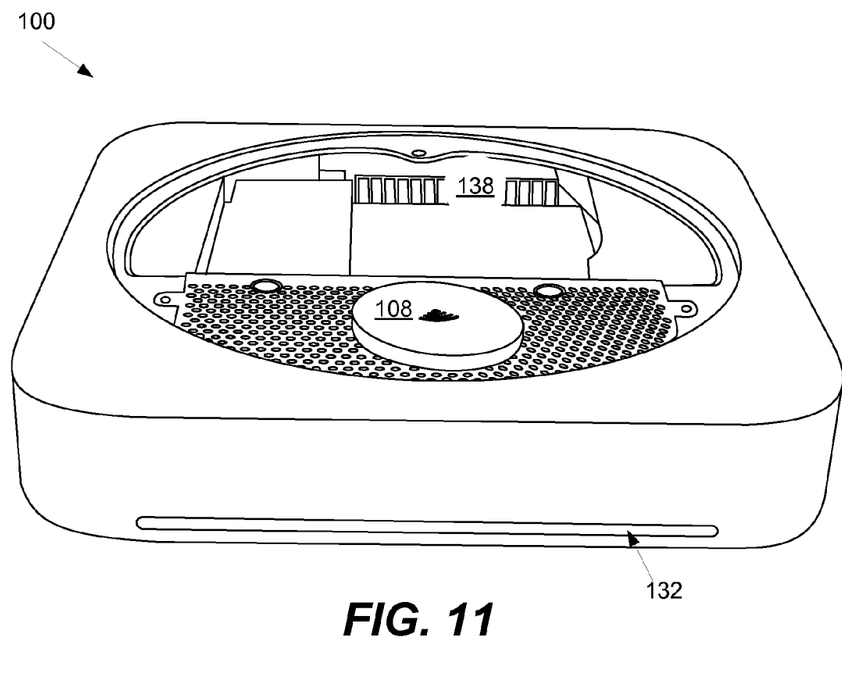
FIG. 11 illustrates in bottom perspective view the exemplary small form factor desktop computing device of FIG. 10 with the fan removed therefrom according to one embodiment of the present invention.

FIG. 10 illustrates in bottom perspective view an exemplary small form factor desktop computing device with its removable foot removed therefrom according to one embodiment of the present invention, while FIG. 11 illustrates in bottom perspective view the exemplary small form factor desktop computing device of FIG. 10 with the fan removed therefrom. These figures simply provide alternative viewpoints for items that have already been described in detail above. In some embodiments, the angle of the angled fins can be about 20 to 60 degrees, so as to obscure the internal components of the device from being seen to an outside user by way of the air processing manifold and exhaust. In some embodiments, the exact angle of the angled fin stack can be about 30 degrees.

Figure 12:
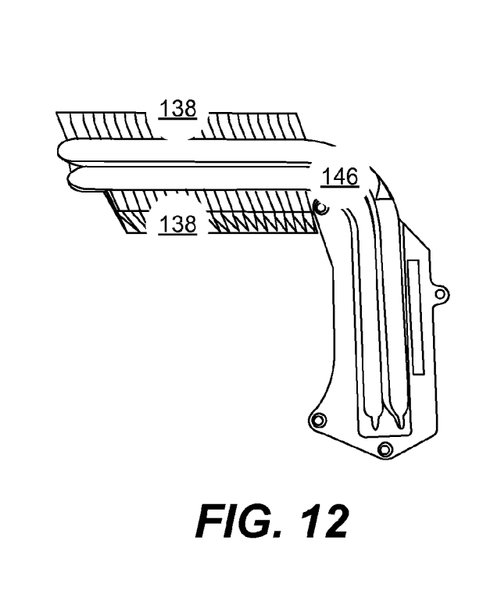
FIG. 12 illustrates in top plan view an exemplary air processing manifold and heat exchanger according to one embodiment of the present invention.
Figure 13:
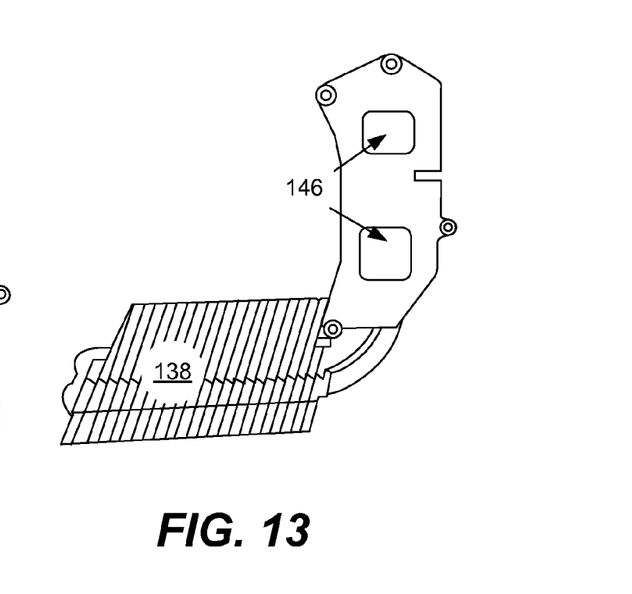
FIG. 13 illustrates in bottom plan view the exemplary air processing manifold and heat exchanger of FIG. 12 according to one embodiment of the present invention.

FIG. 12 illustrates in top plan view an exemplary air processing manifold and heat exchanger according to one embodiment of the present invention. Again, heat pipe or exchanger 146 is laid atop a cutaway portion of a stacked and angled fin arrangement that forms air processing manifold 138. Accordingly, the air processing manifold 138 can be seen on either side of the heat exchanger 146. FIG. 13 illustrates in bottom plan view the exemplary air processing manifold and heat exchanger of FIG. 12 according to one embodiment of the present invention. Two or more heat sinks 146 on the bottom of the heat exchanger can be used to facilitate the ready heat transfer of heat from a heated element that comes in contact with the heat sinks, as will be readily appreciated.

Figure 14:
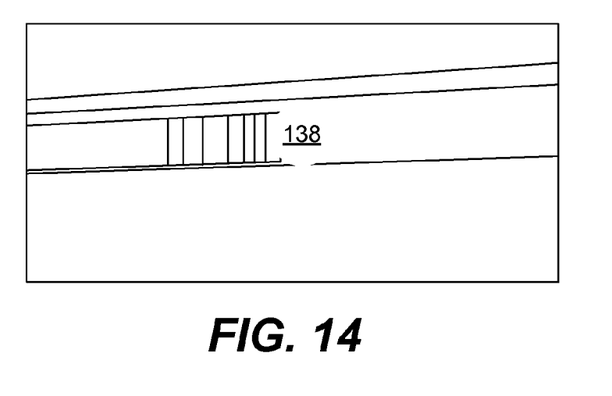
FIG. 14 depicts in side angled view the exemplary air processing manifold and heat exchanger of FIG. 12 according to one embodiment of the present invention.

FIG. 14 depicts in side angled view the exemplary air processing manifold and heat exchanger of FIG. 12 according to one embodiment of the present invention. As shown, a line of sight can be made along the angled fin stack, but achieving such a line of sight requires a significant skewing of the device. Accordingly, the ready viewing of internal components is hindered.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Certain changes and modifications may be practiced, and it is understood that the invention is not to be limited by the foregoing details, but rather is to be defined by the scope of the appended claims.

What is claimed is:

1. A small form factor desktop computing device, comprising:
    a single piece housing having a top surface, rear surface, and a bottom opening arranged to provide access to internal operational components, a front opening arranged to accommodate a plurality of I/O interfaces, and a slot opening arranged to receive a disk medium;
    a removable foot disposed within the bottom opening and adapted to be removed by a user to provide access to at least some operational components enclosed within the single piece housing, wherein an interface between said single piece housing and removable foot is arranged to permit ambient air intake into the device;

a heat producing element;

a fan arranged within the single piece housing and proximate the removable foot, wherein said fan is adapted to process the ambient air intake and disperse the ambient air through an outlet of the fan;

an air processing manifold having a plurality of angled fins, wherein an inlet of the air processing manifold is located proximate to the fan outlet and an outlet of the air processing manifold is located at an opening along the rear surface of the single piece housing; and a heat exchanger located proximate to the air processing manifold and arranged such that air passing through the air processing manifold directly contacts one or more exterior surfaces of the heat exchanger, wherein the heat exchanger also includes a heat sink portion that is thermally coupled to said heat producing element.

2. The small form factor desktop computing device of claim 1, wherein said housing is substantially a single component formed from a single piece of material.

3. The small form factor desktop computing device of claim 2, wherein said housing consists of a single piece seamless housing formed from a single metal billet.

4. The small form factor desktop computing device of claim 1, wherein said removable foot defines a perimeter therearound, and wherein at least a substantial portion of the ambient air intake occurs between the perimeter and said housing.

5. The small form factor desktop computing device of claim 4, wherein the perimeter of said foot includes an air intake region and a no air intake region, and wherein none of the ambient air intake occurs at the no air intake region.

6. The small form factor desktop computing device of claim 5, wherein said fan is located proximate the no air intake region, and wherein an airflow pattern from the air intake region past the no air intake region and into said fan is created thereby.

7. The small form factor desktop computing device of claim 4, wherein the entire perimeter of said foot provides an air intake region.

8. The small form factor desktop computing device of claim 1, wherein a cooling airflow pattern through the device is defined by the ambient air intake into the device, fan, and air processing manifold.

9. The small form factor desktop computing device of claim 1, wherein no inlet or outlet of cooling air into or from the device occurs at or near the top surface.

10. A personal computing device, comprising:

an outer housing defining an interior cavity, said outer housing having a top surface and a bottom opening arranged to provide access to internal operational components located within the interior cavity;

an ambient air intake into the personal computing device, said ambient air intake being located at or proximate to the bottom opening;

at least one heat producing element;

a fan located within the outer housing and proximate the bottom opening, wherein said fan is adapted to process ambient air from the ambient air intake and disperse the ambient air through an outlet of the fan; and an air processing manifold located within the outer housing and proximate to the fan outlet, said air processing manifold being arranged to receive air from the fan outlet and pass the air therethrough to an outlet of the air processing manifold and out of said outer housing, wherein the air passing through the air processing manifold is adapted to facilitate the cooling of said at least one heat producing element;

a removable foot disposed within the bottom opening and adapted to be removed by a user to provide access to at least some operational components enclosed within the outer housing, wherein an interface between said outer housing and removable foot defines said ambient air intake into the personal computing device; wherein said removable foot defines a perimeter therearound, and wherein at least a substantial portion of said ambient air intake occurs between the perimeter and said outer housing.

11. The personal computing device of claim 10, further comprising:

a heat exchanger located proximate to the air processing manifold and arranged such that the air passing through the air processing manifold directly contacts one or more exterior surfaces of the heat exchanger, wherein the heat exchanger also includes at least one heat sink portion that is thermally coupled to said at least one heat producing element.

12. The personal computing device of claim 10, wherein said air processing manifold includes a plurality of angled fins adapted to direct the flow of air therethrough.

13. The personal computing device of claim 10, wherein a cooling airflow pattern through the personal computing device is substantially defined by the ambient air intake into the personal computing device, the fan, and the air processing manifold.

* * * * *